(12) United States Patent
Vodopivec et al.

(10) Patent No.: US 6,424,368 B1
(45) Date of Patent: Jul. 23, 2002

(54) SYSTEM FOR THE TRANSFER OF DIGITIZED IMAGES TO AN IMAGE SUPPORT OR VICE-VERSA

(75) Inventors: Jozef Vodopivec; Cesare Fumo, both of Gorizia (IT)

(73) Assignee: New System S.R.L. et al., Gorizia (IT)

( * ) Notice: Subject to any disclaimer, the term of this patent is extended or adjusted under 35 U.S.C. 154(b) by 0 days.

(21) Appl. No.: 09/331,490
(22) PCT Filed: Dec. 23, 1996
(86) PCT No.: PCT/IT96/00264
§ 371 (c)(1), (2), (4) Date: Sep. 7, 1999
(87) PCT Pub. No.: WO98/28666
PCT Pub. Date: Jul. 2, 1998

(51) Int. Cl.[7] .................................................. B41J 2/435
(52) U.S. Cl. ........................................ 347/234; 347/248
(58) Field of Search ................................ 347/234, 239, 347/242, 248, 257; 355/67, 68, 71, 72

(56) References Cited

U.S. PATENT DOCUMENTS

| | | | |
|---|---|---|---|
| 4,176,947 A | 12/1979 | Bain-Smith et al. | 355/53 |
| 4,198,701 A | 4/1980 | Reddersen et al. | 365/127 |
| 5,343,271 A | 8/1994 | Morishige | 355/53 |

FOREIGN PATENT DOCUMENTS

| | | | | |
|---|---|---|---|---|
| GB | 2 187 855 A | 9/1987 | | H04N/1/23 |
| WO | 93 24326 A | 12/1993 | | B41B/19/00 |

*Primary Examiner*—Hai Pham
(74) *Attorney, Agent, or Firm*—Wenderoth, Lind & Ponack, L.L.P.

(57) ABSTRACT

An improved photoplotter for obtaining high resolution films from computer digitized images is equipped with active plate system with a plurality of luminous sources and a counter-plate which form an air cushion within which is inserted the film to be exposed. The film is supported on one side by a plotter movement system that moves it within a field of a portion of the entire image divided into a raster, so that the entire image can be obtained with the corresponding luminous sources.

6 Claims, 2 Drawing Sheets

SYSTEM FOR THE TRANSFER OF DIGITIZED IMAGES TO AN IMAGE SUPPORT OR VICE-VERSA

TECHNICAL FIELD

An object of the present invention is a system for the transfer of digitized images on sensitive support material or vice-versa. A further object of the present invention is a machine for obtaining the system. The innovation finds particular, if not exclusive, application, in the field of high resolution images as, for example, in the making of films.

In this high resolution field, the resolution is meant to be considerable and of the professional type, and may be rightly considered, even if not in a limitative way, as being comprised within a value of 10 pixel pitch microns as the distance between two pixels. This value is also commonly defined as a raster of less than or equal to 10. Obviously, pixels, in computer language, are defined as known points which, together, compose an image.

The process itself of transferring the digitized image as pixels from a computer to a machine that carries out reproduction is here defined as the process of rasterization. One of the main, if not exclusive, purposes of this process is that of production of printed circuits.

However, nothing prevents the system and the machine from being used in any other field in which photographic film is required, as for example the typographical field, etc.

BACKGROUND OF THE ART

In the prior art, machines for sensitizing camera films with different photosensitive materials for a variety of purposes are known. The high resolution machines are based substantially on the use of a luminous head, or in the technically more advanced solution of a laser head, which sensitizes the photosensitive material. The machines include a cylindrical or flat support for the photosensitive material.

When a cylindrical support is used, there are two solutions. Either a drum is rotating and the head moves transversely in a back and forth movement, or the cylinder is fixed and is hollow, the photosensitive sheet is inserted inside the cylinder, and the head is axially placed in the cylinder and the head not only moves alternatively in a back and forth movement, but also rotates. In this way, with the respective movements suitably coordinated, the digitized image is reconstructed by carrying respective points, one behind the other, on the basis of respective coordinates, up to the complete reconstruction of the image.

The solution on the flat support is less used because it is considered to be complex and expensive, as compared to the solutions using the cylindrical support and utilizes substantially the same principle. A difference is that the solution relying on the flat support works as a plotter in which a plotting head moves on a surface of the flat support along the respective coordinates, just like a drawing plotter in a computer.

All of the above-mentioned solutions are expensive and difficult to implement, and in any case, require lengthy reproduction times. Further, although to resolution is obviously higher in the laser versions, the time and costs for the purchase and maintenance of these machines remains very high, due to the presence of a substantial number mechanical parts in motion.

In analyzing all of these types of machines, the presence of only one operating head can be noticed. The one operating head can send one or more points at a time, in logical succession, up to completion of the entire image on the surface chosen for the (exposure, starting, for example, from an upper angle until reaching a lower diametrically opposite angle. The logical succession of these steps makes practically impossible to increment considerably the operative speeds of these machines.

GB-2187855 discloses a photoplotter using light valve device using a single light source, a support for a sheet of photosensitive material for exposure and a light valve device interposed between the light source and the sheet to divide the sheet image in a plurality of spaced subareas or pixels, the light transmissivity of which are individually controlled through an associated computer to cause the exposure to be that of a desired graphic or artwork. The light valve device may be moved relative to the sheet to expose areas corresponding to those originally associated with the space between the pixels. This solution is very interesting but has the drawback of not being able to control the entire figure because of the shadow of the light valve device.

WO 9324396 A discloses a method and device for retaining a thin medium between two bodies. In particular, with an emphasis on faster and better exposure of the medium, electronic chips have been developed by means of which a plurality of selectively modulable light channels can be romed. These chips may be used for building a rod transversely to the medium for exposure, so that the medium is illuminated in a coherent line in its entire width (U.S. Pat. Nos. 4,899,222, 5,030,970, GB 187855).

U.S. Pat. No. 4,176,947 discloses a step and repeat mechanism. In particular, it concerns an apparatus for moving sheet material, primarily microfiche, into a plurality of X and Y axis position by means of a gas cushion formed on a plate in which the sheet material is shifted by means of ducted gas jets or sweeps.

SUMMARY OF THE INVENTION

The aim of this invention is to avoid the above-mentioned drawbacks, and in particular to make an inexpensive, reliable, and fast machine that requires minimum maintenance, is easy to use, and in which the resolution level can be the highest without endangering in any way a necessary suitable resolution level, as mentioned above.

These and other aims are reached as claimed by a system for the transfer of digitized images from a computer to photosensitive image support material or vice-versa. The system comprises an active flat plate means for the exposure or detection of an image, on which can be placed a sheet which must be exposed or subjected to detection which involves a plurality (n) of illuminable sources of punctiform exposure or detectors, arranged in a fixed way in a raster of (n) squares. The plurality (n) of illuminable sources of punctiform exposure or detectors are connected/connectable to a digital system of the computer image, and able, by means of suitable software to be activated. Each of the plurality of sources or detectors only operates on one point, corresponding to only one pixel of a square at a time. Each square (n) of the raster being able to include a plurality of pixels or points of the image equal to (x), and in such a way that the total number of pixels or points of the entire image is equal to (nx).

The system also comprises support means for the sheet on the active plate means, and means for moving the active plate and/or the image sheet. The means for moving being able to move at least one of the active plate means and the sheet with respect to each other according to digitized coordinates corresponding to at least the portion (n) of the entire image to be digitized, and to activate for successive points, one adjacent to other illuminable sources of punctiform exposure or detector, each time and step by step for exposure on the photosensitive material, so that illuminable sources of punctiform exposure or detectors, sensitize/detect the entire surface corresponding to its own square (n) of the sheet to be treated. This results in the entire image being sensitized in an exact reproduction of the original with the aid of the (n) luminous sources/detectors, each one displaced in connection with each square of the raster.

In this way, there is an immediate advantage of increasing the transfer and sensitizing speed by many times, corresponding to the number of sections (n) of the raster. This increase in speed obviously considers the theoretical side and the fact that the electronic transfer operation moves at the speed of light. Considering further, that there is more complex processing and calculation associated with this system, the operative times are reduced by more than 70%, with the further advantage of an important simplification of the system, lower manufacturing costs (for the active plate and the use of common "LEDs"), etc.

Advantageously, the movement is communicated to the photosensitive sheet which is kept suspended among the active plate and the counter-plate in a cushion of air. In this way, the movement is very slight, fast and quick and does not involve moving considerable masses. Furthermore, the photosensitive material does not touch the surface of the active plate and is not damaged.

Advantageously, the air bearing is made by means of a plurality of punctiform air-jets made in the opposite plates so that the sheet is kept suspended between the two surfaces, while the movement mechanism will clamp the sheet only on one side for its simple and limited movement.

These and other advantages will appear from the following embodiments described with the aid of the included drawings whose details are not to be considered limitative, but only supplied as an example.

DETAILED DESCRIPTION OF THE INVENTION

With regard to the above mentioned Figures, it is disclosed that an active plate 1 is indicated which includes in it a reticulation of "n" squares, each involving a LED 11 illuminable according to a program able to sensitize in a punctiform way a photosensitive film 3 to be exposed that is placed between the active flat plate 1 and a counter-plate 2.

Figure 1:
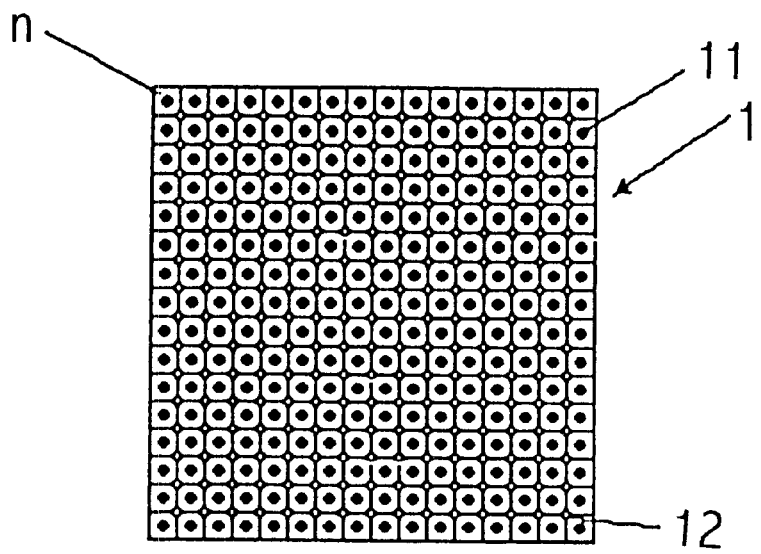
FIG. 1 is a schematic front view of a sensitizing active plate.
Figure 2:
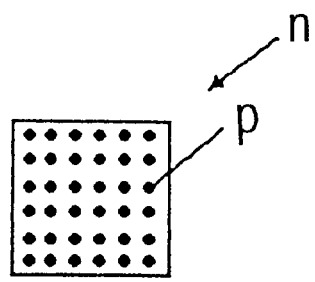
FIG. 2 is an enlarged view of an "n" portion of a sub-division raster that theoretically is made up of an image to be copied, including a plurality "x" of points or pixels that make up the image.
Figure 3:
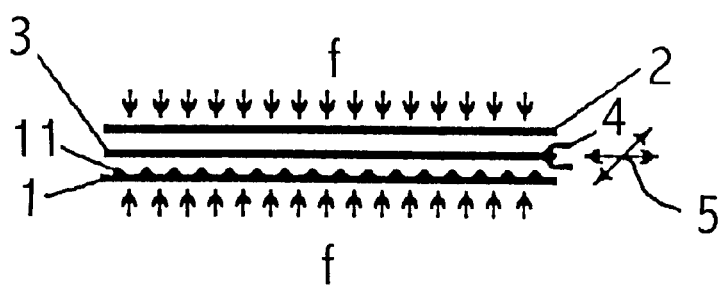
FIG. 3 is a cross sectional schematic view of a machine involving an active plate, its counter-plate and a mechanism with a respective sensitizing sheet suspended and moved between the two plates.

Both the active plate 1 and the counter-plate 2 are equipped with a plurality of holes 12 preferably uniformly distributed that launch opposite compressed air jets (f), in order to allow for the support of a sheet suspended between them, self-centered in a respective air bearing, as schematically visible in FIG. 3. Advantageously, the air jet holes 12 are placed in between the exposure LEDs 11.

The film or photosensitive sheet 3 to be exposed is introduced between the plates 1 and 2 by a loader as in the prior art and is clamped by a clamp or suitable clamping means 4, and is therein kept suspended. The plates in particular, are approached in a guide position and the active plate 1 is also in the position with the respective LED 11 to expose the film 3. The support of the film 4 is movable by using means of the prior art shaped as a plotter to operate the transfer of the image by a scanner system.

Figure 4:
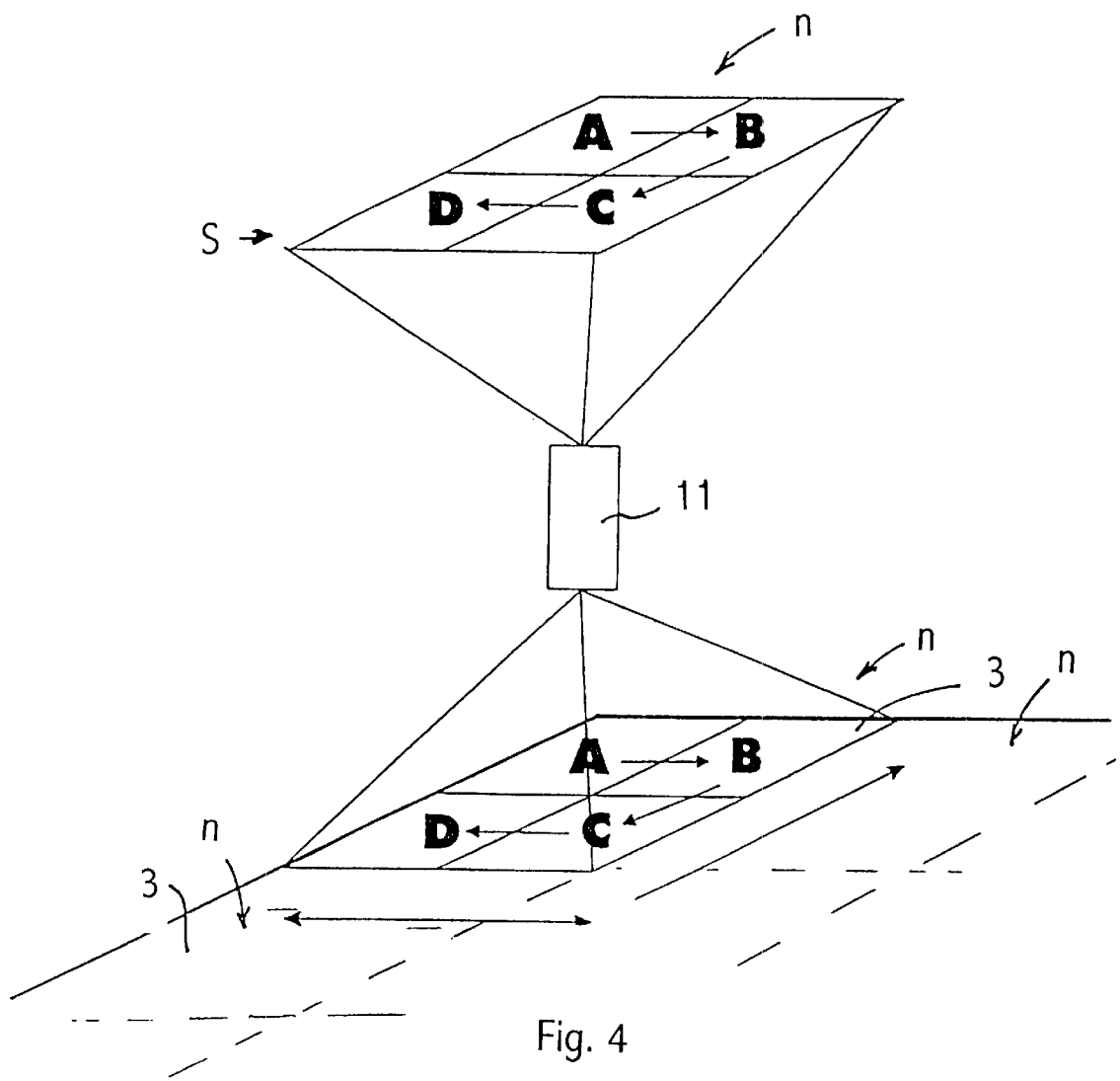
FIG. 4 is a schematic view of a movement scheme for a transfer of a image from a computer to a sensitive support material, an inverse operation in a like and symmetric way being possible.

As disclosed in FIG. 4, an image in a computer S, is divided into a plurality of sectors, as on a draughtboard, in which each sector of a respective raster "n" is a portion to be scanned. The operation may also be carried out digitally by control software and in this way, a specular movement A-B-C-D will be obtained. That is, with translators, decoders and encoders, and processors, the image will be suitably transmitted on the film of the photosensitive sheet 3 or vice-versa with an inverse process.

Referring back to the inventive concept, as previously mentioned, the invention relates to a system for the transfer of digitized images from a computer S to a photosensitive support material 3 or vice-versa. The system comprises the active flat plate exposure means 1 for the photosensitive material 3, on which can be placed the photosensitive material 3 that must be exposed. Exposure which involves the plurality of (n) illuminable sources 11 of punctiform exposure arranged in fixed way in the raster of (n) squares. The illuminable sources are connected/connectable to the computer system S relative to the digital image, and are able, with suitable software, to be one of sources or detectors 11 lighted according to the digitized image to be transferred, but carrying only one point (p) corresponding to only one pixel (p) per square (n) at a time. Each square (n) of the raster is able to include a plurality of pixels or points of the image equal to (x), so that the total number of the pixels or points of the entire image is equal to (nx).

The system further comprises support means 4 of the photosensitive material 3 on the active plate exposure means 1, and movement means 5 of the active plate 1 and/or of the photosensitive material 3, capable of moving at least one of the plate 1 and the photosensitive material 3 with respect to each other according to digitized coordinates corresponding to at least the portion (n) of the entire image to be digitized, and to activate by successive points the illuminable sources of punctiform exposure, each time and step by step for pending exposure on the photosensitive material (3), so that each source sensitizes the entire surface corresponding to its own square (n) of the material to be sensitized in order to obtain the desired entire image with the aid of the (n) luminous sources, each located in connection with each of the squares (n) of the raster.

The system obviously is embodied in a machine that includes two opposite plates, an active one for the sensitization of the photosensitive sheet and an opposite one. Both these plates have opposite air jet holes to support the photosensitive sheet (film between them). A clamping system for the sheet between the plates provides movement. More particularly, referring to the Figures, it is disclosed that the photosensitive sheet is simply inserted between the two surfaces, one of which is the support of the numerous light sources. The light sources are arranged in order to cover the entire surface of the photosensitive sheet (film).

The relative displacement between film and light sources, allows light to reach any point of the film and therefore, to sensitize it with the digitized image as wished and in the desired resolution level. The machine consists of a pedestal inside of which is placed a box with the films and the system for the loading of the film (the system is not described, but it is of prior art as, for example, those used in the automatic sheet loaders).

Each sheet is transferred in the exposition area inside of the opposite plates. The film is fixed before the exposure in a biaxial movement system. From the nozzles of the plates, jets of air come out that keep the sheet always centered, preventing its contact with the opposite surfaces. The plates are placed close to each other, but avoiding contact, so that a cushion of air is obtained between the surfaces in relative movement.

The system may be made operative by suitable software that will be responsible for giving instructions on the use of the system. The software will cause the system to collect the digital data of the image, and prepare the data in a way corresponding to the size and resolution required by the exposure device, so that the data can be transmitted to the single light modulators in correlation to the path that they describe in the exposure process.

The input to the exposure process is always given digitally. The original image can also be digitized starting from a simple photo or similar support material by using scanners or other image digitizers. If the image is supplied with vectorial data, this is rasterized by using the exposure resolution. Before beginning the exposure process, it is necessary to adapt the size and the resolution of the image to the size and the variable parameters of the exposure device and a ratio pixel:pixel is established. This is determined by the mechanical characteristics of the exposure device, and by the measurement of the original image. Thus, a "bitmap" type image is obtained. This can reduce the space needed and can also be in a compressed shape. As a result, the image is divided in single sectors corresponding to the square positions (n).

Additionally, the data of each sector are sorted in a sequence corresponding to the movement between exposure device and exposed object. The data are transmitted to the single modulators (light sources) in synchronism with the relative displacement of position in order to cover the entire surface of the area to be elaborated. The displacement of the films occurs on two axes. The pitch of the displacement also defines the resolution that the machine is able to give, and which can be different for each axis.

The stroke of each of the two axes is determined by the distance between the two adjacent points (spots). When the path on the first axis ends, the second axis is displaced by one pitch. The exposure ends when the second axis completes the entire stroke.

It must be highlighted that the solution adopted allows a displacement of the film with minimum movement, as the stroke is defined by the distance between the luminous beam "spots", it can be reduced to the minimum. Thus, a highly reduced total time of exposure and a precision certainly higher is obtained, if compared to the traditional solutions. Of course, the system can also be utilized in an inverse way, that is for transferring a graphic image from a respective external support material (e.g. paper) to the computer as a digitized image.

What is claimed is:

1. A system for transferring an image between a computer and a photosensitive image support material, said system comprising:

an active flat plate having a plurality of holes therein;

a counter-plate parallel to said active flat plate, said counter-plate having a plurality of holes therein, wherein said pluralities of holes in said active flat plate and said counter-plate are operable to suspend the photosensitive image support material between said active flat plate and said counter-plate when air flows through said pluralities of holes;

a plurality of image transferring devices of one of illuminable sources of punctiform exposure and detectors, said image transferring devices being located at said active flat plate and being operable to connect to the computer, each of said image transferring devices being operable to illuminate and expose one point corresponding to one pixel on the photosensitive image support material at a time if said image transferring devices are said illuminable sources or being operable to scan one point corresponding to one pixel on the photosensitive image support material at a time if said image transferring devices are said detectors, wherein each of said image transferring devices is located at said active flat plate such that each of said image transferring devices is operable to illuminate, if said image transferring devices are illuminable sources, or operable to scan, if said image transferring devices are detectors, each of a plurality of points in a respective square of a raster of squares which covers the image as a whole, each of the respective squares including a plurality of points of the image, so that a total number of points of the image equals a number of the plurality of points included in each of the respective squares of the raster of squares multiplied by a total number of squares in the raster of squares;

a clamp operable to hold the photosensitive image support material; and a biaxial movement system operable to move at least one of said active flat plate and the photosensitive image support material with respect to each other according to digitized coordinates corresponding to the image, wherein said image transferring devices are movable with respect to the photosensitive image support material such that each of said image transferring devices selectively illuminates and exposes, if said image transferring devices are illuminable sources, or scans, if image transferring devices are said detectors, each of the plurality of points in the respective square of the raster of squares successively, so that the image as a whole is addressed on the photosensitive image support material.

2. A system according to claim 1, wherein said clamp holds one side of the photosensitive image support material.

3. A system according to claim 1, wherein said image transferring devices are selectively operated independently from each other.

4. A system according to claim 1, further comprising a means for turning on and off said image transferring devices in a programmed way.

5. A system according to claim 1, further comprising an automatic loader operable to load the photosensitive image support material between said active flat plate and said counter-plate.

6. A method for transferring an image between a computer and a photosensitive image support material with an exposure device, the exposure device having an active flat plate, a plurality of illuminable sources of punctiform exposure located at the active flat plate, each of the plurality of illuminable sources being operable to illuminate and expose one point corresponding to one pixel on the photosensitive image support material at a time, wherein each of the plurality of illuminable sources is located at the active flat plate such that each of the plurality of illuminable sources is operable to illuminate each of a plurality of points in a respective square of a raster of squares which covers the image as a whole, each of the respective squares including a plurality of points of the image, so that a total number of points of the image equals a number of the plurality of points included in each of the respective squares of the raster of squares multiplied by a total number of squares in the raster of squares, and a biaxial movement system operable to move at least one of the active flat plate and the photosensitive image support material with respect to each other according to digitized coordinates corresponding to the image for selectively exposing the photosensitive image support material, wherein the plurality of illuminable sources are moved with respect to the photosensitive image support material such that each of the plurality of illuminable sources selectively illuminates and exposes each of the plurality of points in the respective square of the raster of squares successively, so that the image as a whole is covered, said method comprising:

collecting digital data of the image;

preparing data and digitized coordinates from the digital data to correspond to a size and resolution required by the exposure device and a relative displacement of position, respectively, so that the data and the digitized coordinates can be properly transmitted to the plurality of illuminable sources and the biaxial movement system, respectively;

transmitting the digitized coordinates to the biaxial movement system to move at least one of the active flat plate and the photosensitive image support material with respect to each other according to the digitized coordinates so that the whole image is covered; and transmitting the data to the plurality of illuminable sources which each use the data to illuminate and selectively expose each of the plurality of points in the respective square of the raster of squares on the photosensitive image support material which cover the image as a whole to transfer the image to the photosensitive image support material.

* * * * *